US006587002B1

(12) United States Patent
Vogt

(10) Patent No.: US 6,587,002 B1
(45) Date of Patent: Jul. 1, 2003

(54) THERMAL CONTROL FOR AN AMPLIFIER

(75) Inventor: Stephan Vogt, Lawrenceville, GA (US)

(73) Assignee: Scientific-Atlanta, Inc., Lawrenceville, GA (US)

(*) Notice: Subject to any disclaimer, the term of this patent is extended or adjusted under 35 U.S.C. 154(b) by 130 days.

(21) Appl. No.: 09/709,932

(22) Filed: Nov. 10, 2000

(51) Int. Cl.[7] .............................................. H02H 7/20
(52) U.S. Cl. ................................ 330/298; 330/207 P
(58) Field of Search .......................... 330/207 P, 289, 330/298

(56) References Cited

U.S. PATENT DOCUMENTS

| 4,727,337 A | * | 2/1988 | Jason | 330/298 |
| 4,878,034 A | * | 10/1989 | Gross et al. | 330/298 |
| 5,723,998 A | * | 3/1998 | Saito et al. | 327/513 |
| 5,994,945 A | * | 11/1999 | Wu et al. | 327/378 |

OTHER PUBLICATIONS

Pentium® III Processor for the PGA370 Socket at 500 MHz to 1.0B GHz Data Sheet, Intel®.

* cited by examiner

*Primary Examiner*—Robert Pascal
*Assistant Examiner*—Henry Choe
(74) *Attorney, Agent, or Firm*—Kenneth M. Massaroni; Hubert J. Barnhardt, III; Shelley L. Couturier

(57) ABSTRACT

The preferred embodiment describes a thermal controller (305) that provides protection for heat sensitive devices (310) within an amplifier module (315). A thermal sensing circuit (370) is used for detecting any increases in temperature surrounding the devices (310) and the output is provided to the thermal controller (305), wherein the thermal controller (305) provides a current-limiting control (445), a voltage control (440), and a status monitor control (450).

12 Claims, 6 Drawing Sheets

Thermal Controller 305

THERMAL CONTROL FOR AN AMPLIFIER

FIELD OF THE INVENTION

This invention relates generally to cable television systems, and more specifically to amplifiers that are used in such systems.

BACKGROUND OF THE INVENTION

A communication system 100, such as a two-way cable television system, is depicted in FIG. 1. The communication system 100 includes headend equipment 105 for generating forward signals that are transmitted in the forward, or downstream, direction along a communication medium, such as a fiber optic cable 110, to an optical node 115 that converts optical signals to radio frequency (RF) signals. The RF signals are further transmitted along another communication medium, such as coaxial cable 120, and are amplified, as necessary, by one or more distribution amplifiers 125 positioned along the communication medium. Taps 130 included in the cable television system split off portions of the forward signals for provision to subscriber equipment 135, such as set top terminals, computers, and televisions. In a two-way system, the subscriber equipment 135 can also generate reverse signals that are transmitted upstream, amplified by any distribution amplifiers 125, converted to optical signals, and provided to the headend equipment 105.

Within the communication system 100, the electrical devices, and specifically the RF portion of the communication system 100, can be designed and installed using an overhead cable system, an underground cable system, or a combination of both. The overhead cable system mounts the electrical devices used in the communication system 100 on coaxial cable 120 hung on poles. The underground cable system mounts the electrical devices in pedestals located on top of or under the ground, and the coaxial cable between the devices is located underground. Typically, the underground cable system is able to maintain a constant temperature within the pedestals; however, at times the electrical devices may overheat due to one or all of the following conditions: poor air circulation in the pedestal; the summer heat; or being in direct sunlight.

Generally, the electrical devices in a communication system 100, such as a cable television system, do not have internal circuitry to protect the devices from excess heat. Electrically, each amplifier 125 utilizes a thermal circuit to ensure the amplifier 125 maintains a unity gain throughout the cascade of the communication system 100 regardless of the surrounding temperature; however, this does not protect the components in an amplifier 125 from overheating. For example, as a result of the excess heat, the sensitive integrated circuits (IC) that are within the amplifier 125 may fail. With a failure of this type, the amplifier 125 will no longer function, resulting in service outages to subscribers in the area. Consequently, the cable television operator wastes time and money locating and fixing the problem, as well as suffers from any lost revenue from the affected subscribers. Thus, what is needed is a protective circuit that protects the components of the electrical devices from overheating, which may cause a catastrophic amplifier failure that results in service outages.

DETAILED DESCRIPTION OF A PREFERRED EMBODIMENT

With the broadening of traditional cable service, the new broadband services that are provided to the subscriber may also include two-way, telephone and/or cable modem services; therefore, it is increasingly more important to the system operators to prevent service outages. The service outages are a result of any number of reasons, but a specific fault pertaining to this invention is an electrical device failure due to overheating the components in the device as a result of the device's internal heat generation and surrounding environment. Subsequently, there is an increased focus on the quality and reliability of the device; it is, therefore, incumbent upon the manufacturers of the electrical devices to design and implement protective techniques to supply a robust product that will assist in this endeavor.

Figure 1:
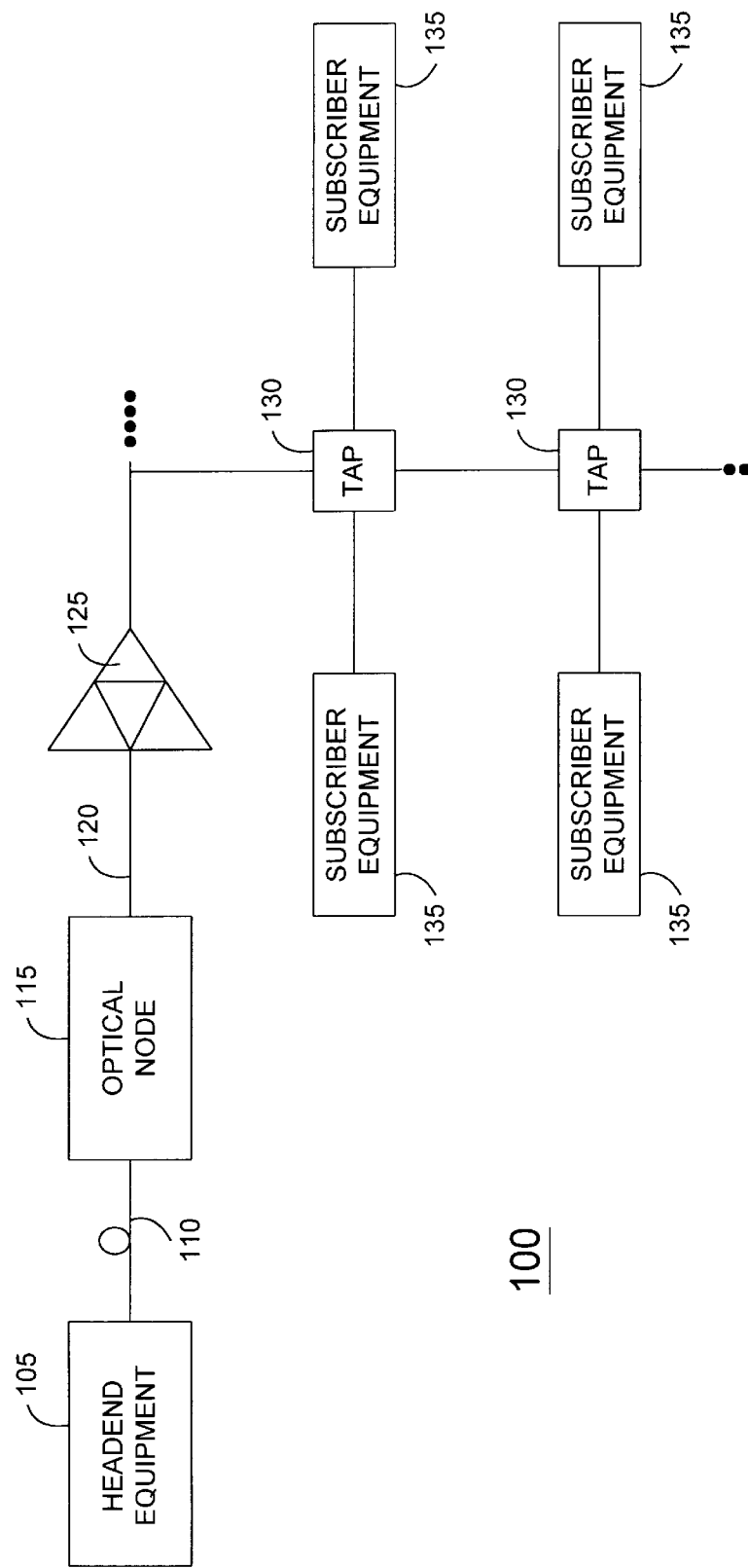
FIG. 1 is a block diagram of a conventional communication system, such as a cable television system.
Figure 2:
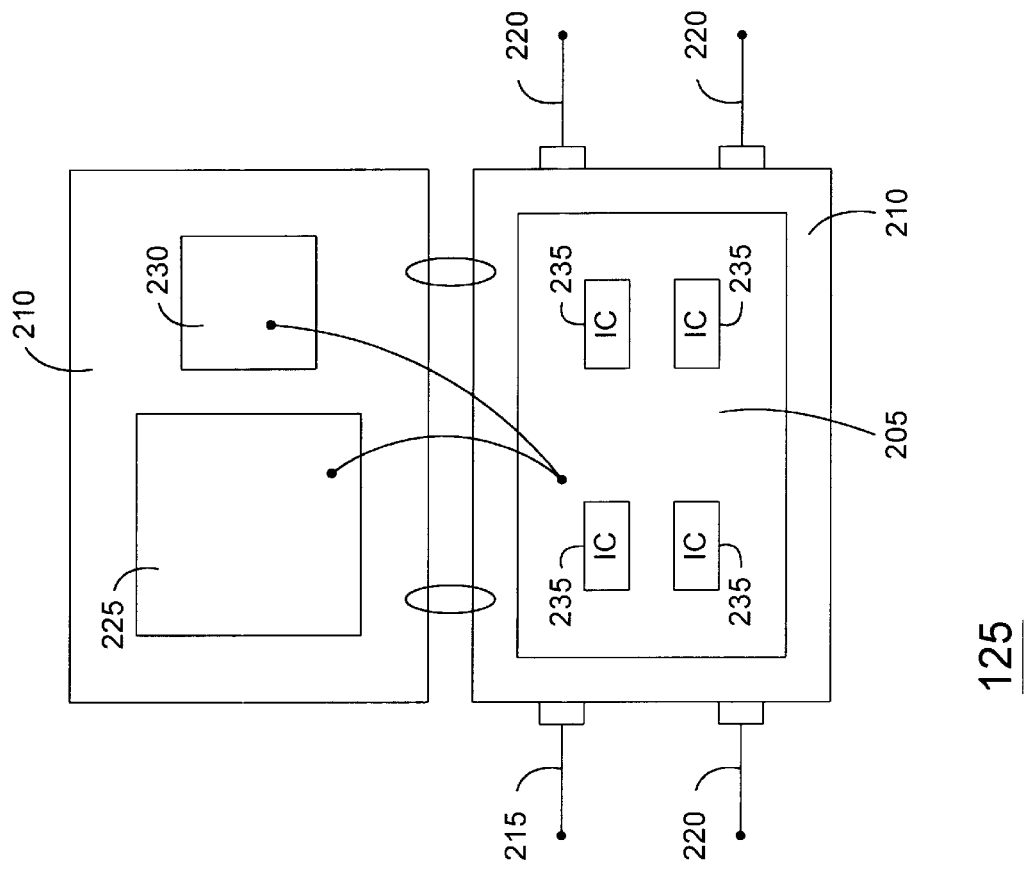
FIG. 2 is a diagram of a conventional amplifier included in the communication system of FIG. 1.

As mentioned briefly in the Background of the Invention, an electrical device, for example, an amplifier 125 as depicted in FIG. 2, may be included in a communication system 100, such as a cable television system. The amplifier 125 includes a module 205 contained within a housing 210. The amplifier 125 also includes an input port 215 for receiving forward RF signals from upstream and output ports 220 for transmitting those signals downstream to the next device in the communication system 100. In the reverse path, the output ports 220 receive reverse RF signals from downstream and transmit them through the input port 215 to the headend equipment 105. The housing lid includes a power supply 225 that supplies direct current (DC) power to the module 205, and the lid also has a position available for a transponder 230 that is electrically coupled between the module 205 and the input port 215. The transponder 230 is a device that communicates with a status monitoring system within the communication system 100.

Status monitoring can be included in the communication system 100 to verify different signal levels within electrical devices, for example, to monitor power supply current and voltage levels and provide control thereof, or to detect any functional faults that have occurred in the device and relay that information back to the headend equipment 105. Software is configured in a workstation that is part of the headend equipment 105. The software sends signals, or controls, to the transponders 230 and receives signals, or responses, from the transponders 230 that can be installed in several electrical devices, such as the optical nodes 115 or the amplifiers 125. Technicians monitoring the software are immediately notified of any problem and have the opportunity to resolve the problem quickly either via the status monitoring software or at the physical location of the device, depending on the severity of the problem.

Electrical devices, such as the amplifier 125, also include heat sensitive components within the module 205. Such heat sensitive components may include integrated circuits 235 that amplify the forward and reverse signals. For example, the integrated circuits 235 are generally included in a small hybrid package that is sensitive to overheating. If overheating occurs within the amplifier 125, the integrated circuits 235 may fail. Typically, the heat sensitive components cannot be repaired in the field; therefore, the module 205 has to be removed from the system 100 and returned to the manufacturer for repair or replacement of the failed components. As a result, there is a service outage to the subscriber from the time the module 205 fails to the time it takes for the technician to replace the module 205.

Figure 3:
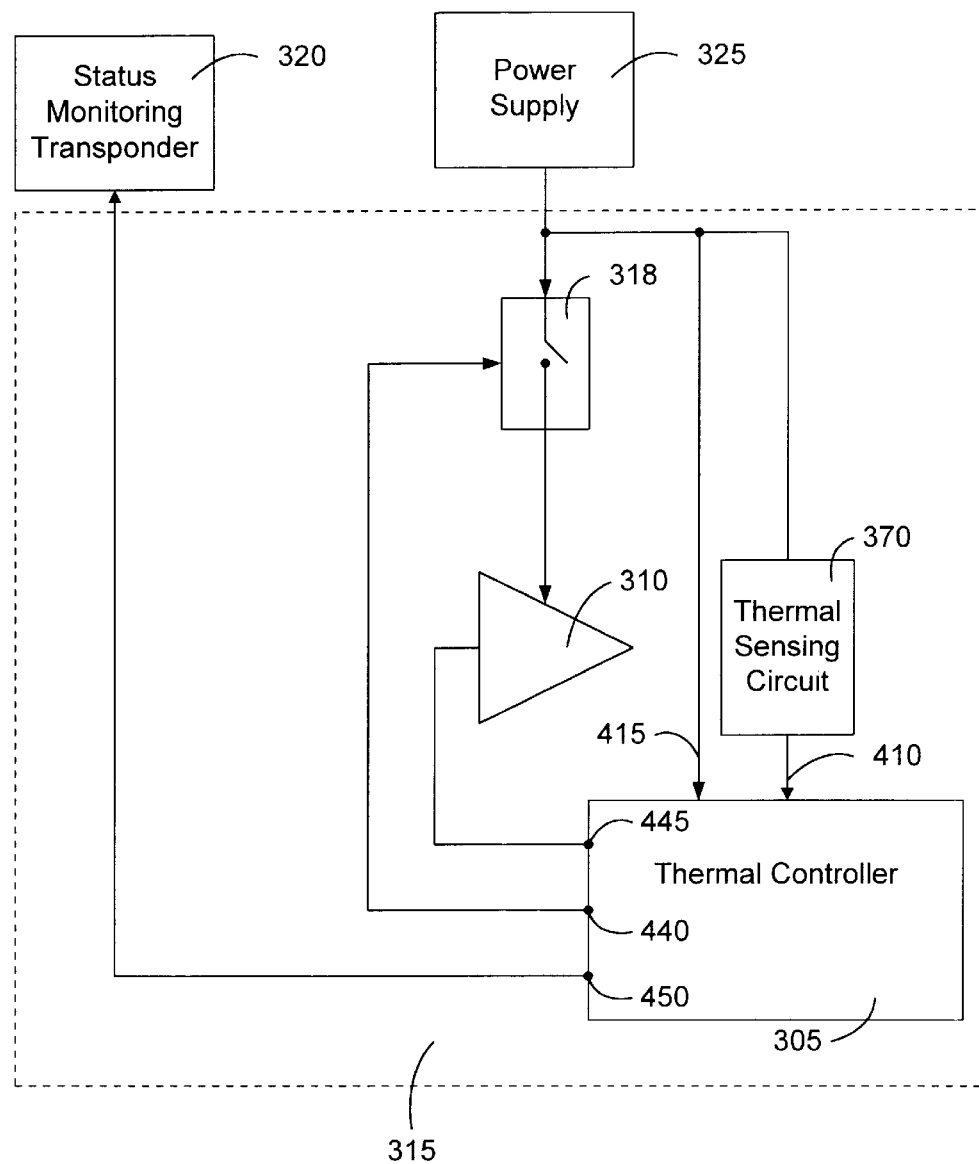
FIG. 3 is a block diagram of the components of an amplifier including a thermal control circuit in accordance with the present invention.

Referring to FIG. 3 and in accordance with the present invention, a thermally protected amplifier 300 that includes a thermal controller 305 is depicted. A primary advantage of the thermal controller 305 is to protect any heat sensitive components 310, such as integrated circuits that are enclosed within a module 315, from increases in temperature by controlling the magnitude of current flow through the components 310 without interruption of services to the subscriber or with complete shutdown of power to the amplifier 300 before catastrophic failure, if necessary. Another advantage is that the thermal controller 305 notifies the technicians of any increased temperatures via the status monitoring transponder 320 that can be installed in the amplifier housing. Thus, the thermal controller 305 minimizes the likelihood that any heat sensitive components included within the amplifier 300 will fail as a result of any excess heat, while at the same time also notifies the technicians of the current situation, allowing them to investigate and repair any problems with the amplifier 300 or with its surroundings, such as a pedestal with limited air flow.

Figure 4:
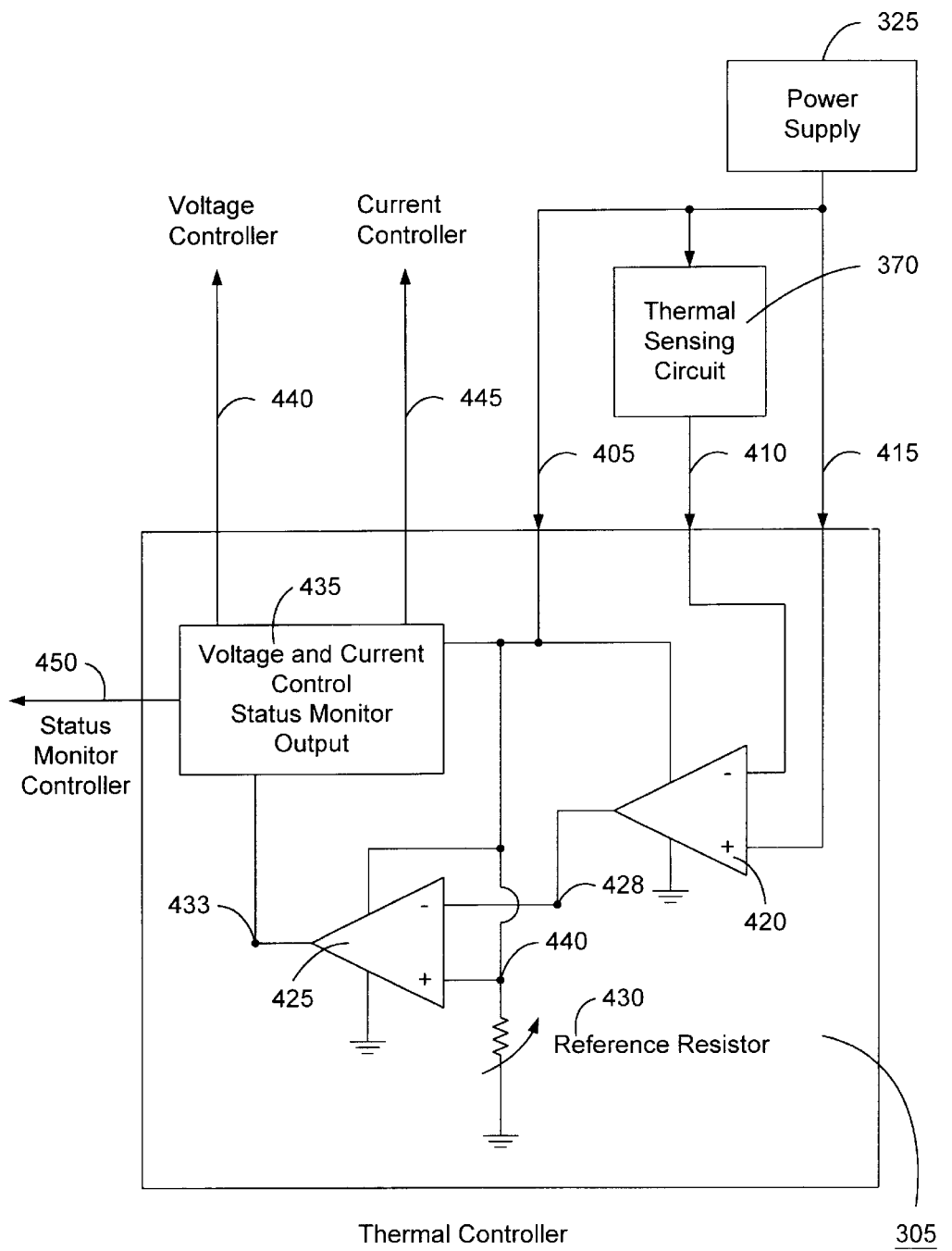
FIG. 4 is a schematic of the thermal control circuit in accordance with the present invention.

Referring to FIG. 4 in conjunction with FIG. 3, the thermal controller 305 is powered by the amplifier's power supply 325 via a DC power input 405. The power supply 325 also supplies the DC power to the module 315, which directs the voltage and current to any components 310 that require power, such as the integrated circuits. The voltage is typically 24V, but also can be configured to supply 12V depending on the module 315 requirements. A first sensor differential input 410 that is provided by a thermal sensing circuit 370 comprises a voltage that is indicative of the temperature relative to, for example, the temperature of the integrated circuits 310, and will be discussed in further detail below. A second sensor differential input 415 provides the voltage from the power supply 325 for comparison by a first differential amplifier 420. The differential amplifier 420 compares the two voltages, and an output voltage, provided at terminal 428, is routed to a second differential amplifier 425. A reference resistor 430 is used to set a second input 440 to the second differential amplifier 425 relative to the desired output 428 of the first differential amplifier 420.

Using a 24V power supply as an example, the module 315 and the internal components 310 typically operate at a voltage of 12V. During normal operation, the first sensor differential input 410 should input 12V and the second differential input 415 should input 24V into the first differential amplifier 420. The output 428 is then 12V, which is provided as the first input 428 into the second differential amplifier 425. The second input 440, taking into consideration an appropriate reference resistor 430, is the desired 12V. The output 433 of the second differential amplifier 425 is then provided to a voltage and current controller 435 for further processing. If, however, the area around the thermal sensing circuit 370 begins experiencing an increase in temperature, the voltage of the first sensor differential input 410 may decrease to 11V, for example. Therefore, the first differential amplifier 420 will output 13V into the input 428 of the second differential amplifier 425. Subsequently, the output 433 of the second differential amplifier 425 will be −1V. The voltage and current controller 435 will then process this variation in voltage, which reflects an increase in temperature around the thermal sensing circuit 370 that may begin affecting the heat sensitive devices 310.

Figure 5:
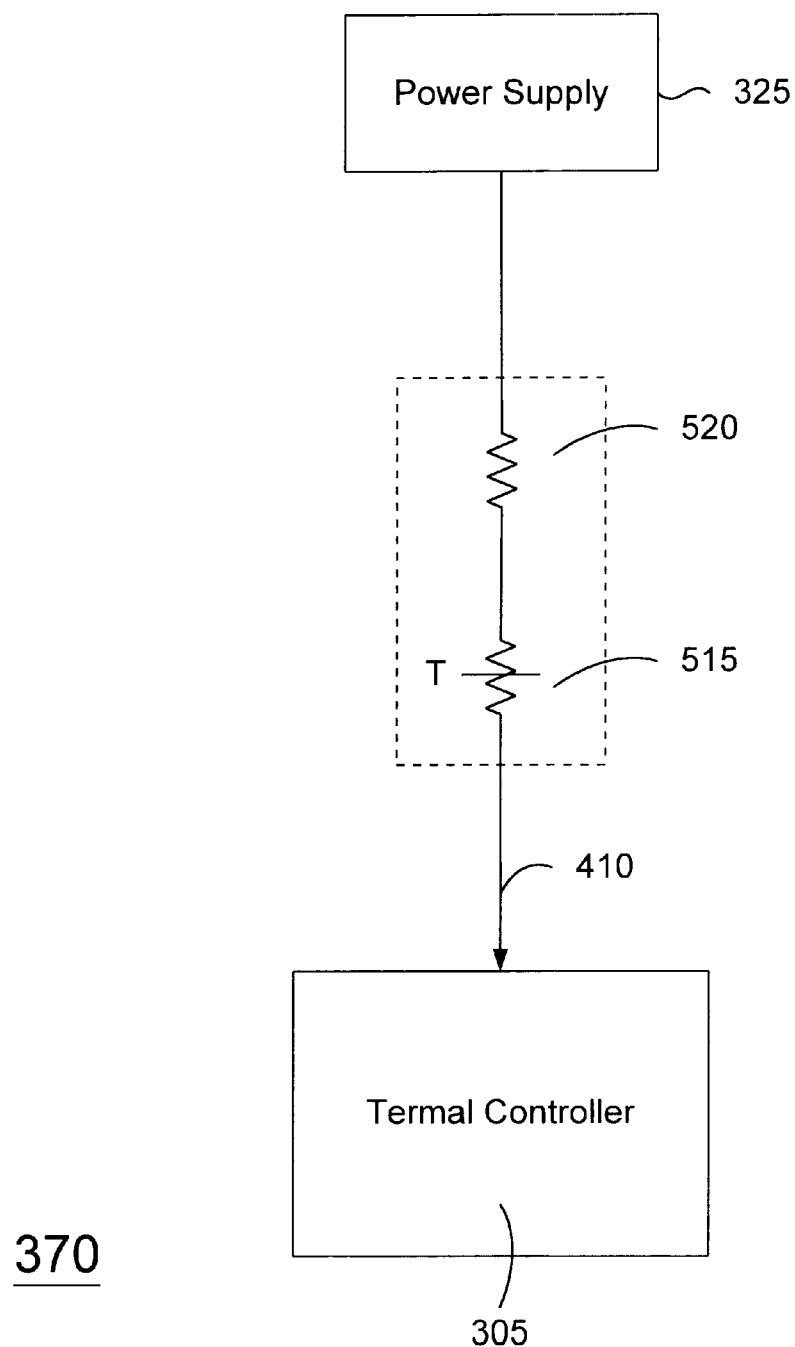
FIG. 5 is a schematic of one embodiment of a thermal sensing circuit within he amplifier of FIG. 3 in accordance with the present invention.
Figure 6:
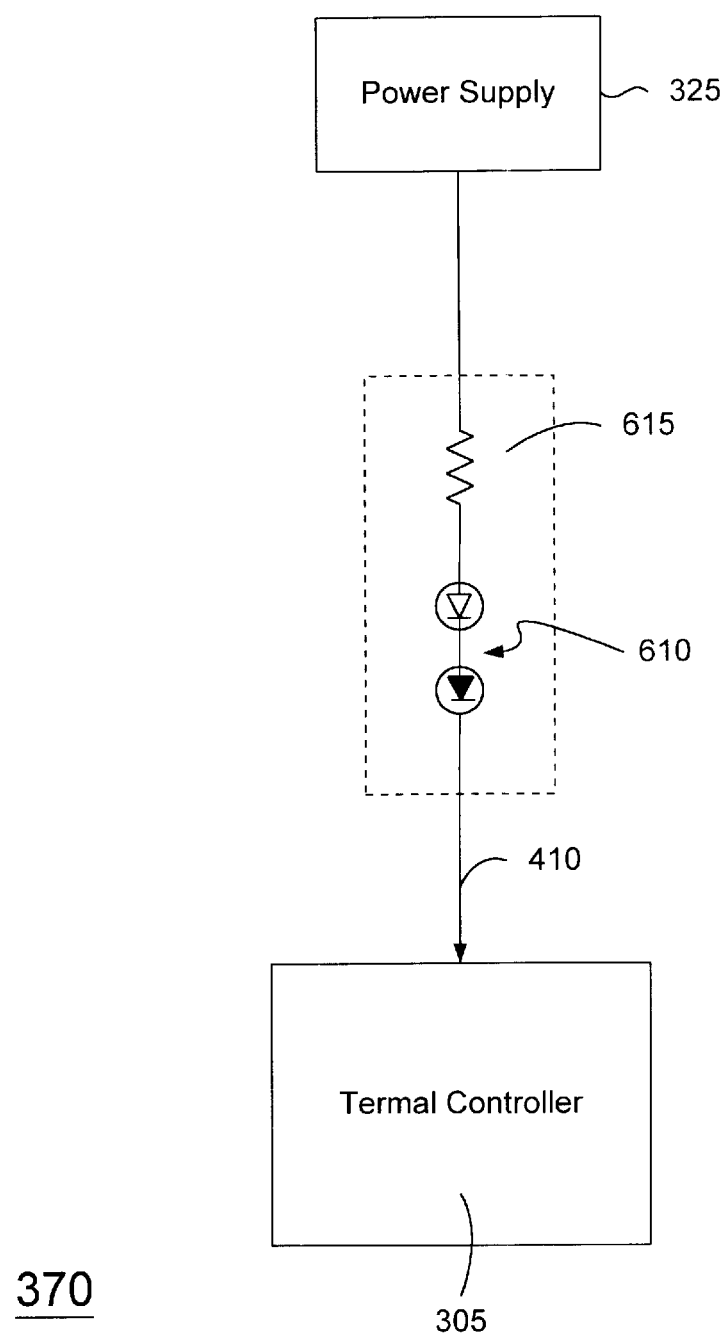
FIG. 6 is a schematic of a second embodiment of a thermal sensing circuit within the amplifier of FIG. 3 in accordance with the present invention.

Returning to the thermal sensing circuit 370, the output voltage provided to the first sensor differential input 410 can be implemented by a variety of thermal sensing techniques. Two embodiments of a thermal sensing circuit 370 are shown in FIGS. 5 and 6. A first implementation 370 (FIG. 5) utilizes a thermistor 515 in series with the voltage from the power supply 325 and a current-limiting resistor 520. The thermal sensing circuitry 370 may, for instance, be located in close proximity to the heat sensitive devices 310. Any variation in voltage across the thermistor 515 is indicative of temperature fluctuations in the surrounding area. More specifically, if the temperature increases, thereby increasing the resistance in the integrated circuits 310, the voltage across the thermistor 515 will decrease. This decrease in voltage is then provided to the first sensor differential input 410 of the thermal controller 305.

Referring to FIG. 6, a second implementation of the thermal sensing circuit is depicted. This embodiment 370' utilizes temperature-sensing diodes 610 in series with the voltage from the power supply 325 and a current-limiting resistor 615. In accordance with this embodiment, the diodes 610 are located outside of, but in close proximity to, heat sensitive components 310 as shown in FIG. 3, or it can, for be located within an integrated circuit. Functionally, the voltages across the diodes 610 vary with temperature. For example, at normal operation, the voltage across the diodes 610 may be 12V. If the temperature increases in close proximity to the diodes 610, the voltage may decrease by 1V. This decrease in voltage is then provided to the first sensor differential input 410 of the thermal controller 305.

Subsequently, the output voltage from each of the above embodiments, which represents the normal operation voltage and any fluctuations due to an increase in temperature, as described above and referring to FIGS. 5 and 6, is used as a thermometer for the heat sensitive devices. The main advantage of the internal thermometer is to detect any temperature increases in the area surrounding the components 310 and provide an accurate temperature reading by way of a voltage signal to the thermal controller 305. If required, it will be appreciated that the circuitry 370, 370' can be designed to reflect any temperature changes within the module 315 with greater precision. For example, by utilizing a variable resistor in place of the current-limiting resistor 520, 615 that is in series with the thermistor 515 or the diodes 610.

Referring again to FIG. 4, the voltage and current controller 435 includes a voltage controller 440, a current controller 445, and a status monitor controller 450. The voltage and current controller 435 also includes a digital signal processor (DSP) that controls all three outputs dependent upon the input 433 from the second differential amplifier 425, which is indicative of the increase in temperature surrounding the components 310. It will be appreciated that the voltage and current controller 435 can also be accomplished by using electronics, such as logic gates, for electrically controlling the three outputs dependent upon the input 433.

The power supply 325 provides the voltage to the DSP controller 435, and circuitry within the controller 435 drops the power supply voltage to an appropriate threshold voltage. The internal circuitry can, for example, utilize predetermined resistor values from an initial design in determining a fixed threshold voltage, which is indicative of a corresponding maximum temperature, or use potentiometers to tune the circuit for varying threshold voltage values to compensate for different rated components 310 that may be used. The threshold voltage is specified by determining the allowable maximum temperature of the monitored heat sensitive devices by taking into consideration all the temperature specifications and choosing the component that exhibits failure at the lowest temperature rating. For example, if the maximum temperature rating for one of the heat sensitive components is 75 degrees Celcius (C), and any increase in temperature above 75 degrees C may cause catastrophic failure for that component, then the threshold voltage will be set at the equivalent voltage value that is provided from the output 433 of the second differential amplifier 425, which would be indicative of the catastrophic increase in temperature surrounding the devices.

Referring to the voltage controller 440, when the voltage from the output 433 of the second differential amplifier 425 equals or exceeds the threshold voltage, the DSP controller 435 provides a signal via the voltage controller 440 that then disables a voltage control switch 318 (FIG. 3). The signal provided by the voltage controller 440 effectively turns off the power supply 325 to the module 315 to protect the internal components from failure. The amplifier 300 will no longer operate until the thermal sensing circuit 370 returns to the normal operating voltage, i.e., temperature, at which time, the voltage at the output 433 of the second differential amplifier 425 will reflect the lowering of temperature which is equal or less than the threshold voltage, and the DSP controller 435 then sends a signal from the voltage controller 440 to the switch 318 effectively turning back on the power supply 325 to module 315.

Conversely, when the duration in the increase in temperature is short and controllable, a limiting look-up table (not shown) is provided within the DSP controller 435 to make minor adjustments in the current being supplied to the module 315 thereby lowering the resistance and regulating the temperature. The DSP controller 435 receives the signal from output 433 and references the look-up table to correspond the received voltage value, i.e., the temperature value, with a limited current rating. The current controller 445 then limits the amount of current that is being supplied to the components 310 by the appropriate value that is indicated in the look-up table. If the adjustments to the current do not lower the temperature, but instead, the temperature continues to rise, the DSP controller 435 will reference the look-up table with an increased voltage value that indicates an even lower current rating. If the temperature continues to increase and the output voltage from the second differential amplifier 425 equals or exceeds the threshold voltage, the current controller 445 then passes control to the voltage controller 440, and the thermal controller 305 will operate in the above-mentioned voltage control situation.

The limiting of current, thereby lowering the internal resistance, allows the module 315 and the internal components 310 to inherently cool and the temperature may return to normal operating temperatures. The main advantage is the amplifier 300 remains functioning and supplying RF signals to the subscriber while the thermal controller 305 decreases the current flow within the heat sensitive devices 310. In addition, the thermal controller 305 attempts to self-regulate the increase in temperature until such time as there may be catastrophic failure of the devices 310 and the thermal controller 305 shuts down the amplifier 300. It will be appreciated that although there may be a little signal degradation due to limiting the current, the amplifier 300 continues providing adequate RF signals throughout the current-limiting period, which results in the subscriber not losing service while the amplifier 300 stabilizes.

An additional feature to the voltage and current DSP controller 435 is the status monitor controller 450. The DSP controller 435 provides a signal via the status monitor controller 450 to the status monitoring transponder 320 that then sends the signal to the workstation in the headend equipment 105. The software in the workgtation effectively monitors each of the outputs of the voltage and current controller 435. For example, the software reflects one of the following conditions from the thermal controller 305: standard operation at normal temperatures; current limiting in effect and to what degree; or the voltage controller has been implemented and the amplifier 300 is shut down. This enhanced feature alerts the technicians to any temperature changes within the module 315 giving them an opportunity to fix a potential problem well before any heat sensitive components are adversely affected.

In summary, the thermal controller 305 is used to monitor and control any temperature fluctuations relative to ally heat sensitive components 310, such as the integrated circuits, within the module 315. The thermal controller 305 limits the current being supplied to the module 315 via the current controller 445 to lower the resistance and thereby lowering excess heat associated with the heat sensitive components. If the heat becomes extreme and is at the point of causing catastrophic failure to the components, the voltage controller 440 will prohibit any further powering, protecting the components. The status monitor controller 450 also provides a signal that notifies the technician as to the current state of the thermal controller 305 at every moment. Therefore, the amplifier 300 continues operation with limited current to a potential point of shutdown due to internal temperature increases, and only when the limiting of the current does not lower the temperature. This allows a technician time to fix any existing problems without complete amplifier failure, or proactively fix a beginning problem without disruption of service to the subscribers.

What is claimed is:

1. A thermal protective device, comprising:
   thermal sensing means for detecting a temperature of a heat sensitive device and for providing a temperature signal indicative of the temperature; and
   a thermal controller coupled to the thermal sensing means, the thermal controller comprising:
   comparing means for receiving the temperature signal and comparing the temperature signal to a desired signal to determine when the temperature has increased;
   a voltage controller for providing a control signal when an increase in temperature is detected that is greater than a threshold value; and
   a current controller for providing a current limiting signal when the temperature has increased.

2. The thermal protective device of claim 1, further comprising a switch coupled to the voltage controller for receiving the control signal and disabling the heat sensitive device responsive to the control signal.

3. The thermal protective device of claim 1, wherein the thermal sensing means comprises a thermistor.

4. The thermal protective device of claim 1, wherein the thermal sensing means comprises a diode.

5. The thermal protective device of claim 1, wherein the thermal controller further comprises:

a look-up table for storing temperature values and corresponding current limiting values, wherein a temperature value is indicated by the temperature signal, and wherein the corresponding current limiting value is referenced to generate the current limiting signal.

6. The thermal protective device of claim 1, wherein the thermal controller further comprises a status monitor controller for providing the control signal and the current limiting signal, wherein the provided signals indicate the status of the thermal protective device.

7. An electronic device for processing signals, the electronic device comprising:
   an input port for receiving the signals;
   an output port for transmitting the signals;
   a power supply for supplying a voltage to the electronic device; and
   electrical circuitry coupled between the input port and the output port for processing the signals; the electrical circuitry comprising:
      an integrated circuit for processing the signals; and
      a thermal protective device for regulating a temperature of the integrated circuit, the thermal protective device comprising:
         thermal sensing means for detecting the temperature of the integrated circuit and for providing a temperature signal indicative of the temperature; and
         a thermal controller coupled to the thermal sensing means, the thermal controller comprising:
            comparing means for receiving the temperature signal and comparing the temperature signal to a desired signal to determine when the temperature has increased;
            a voltage controller for providing a control signal when an increase in temperature is detected that is greater than a threshold value; and
            a current controller for providing a current limiting signal when the temperature has increased.

8. The electrical device of claim 7, wherein the thermal controller further comprises:
   a look-up table for storing temperature values and corresponding current limiting values, wherein a temperature value is indicated by the temperature signal, and wherein the corresponding current limiting value is referenced to generate the current limiting signal.

9. The electrical device of claim 7, wherein the electrical device is an amplifier.

10. The electrical device of claim 9, wherein the amplifier further comprises a transponder, and wherein the thermal controller further comprises:
   a status monitor controller coupled to the transponder for providing a monitor signal, wherein the monitor signal is indicative of the control signal and the current limiting signal, and wherein the transponder provides the signals to indicate the status of the thermal protective device within the amplifier.

11. The electrical device of claim 7, wherein the comparing means comprises:
   a first differential amplifier coupled to the thermal sensing means for receiving the temperature signal, and for comparing the temperature signal with the voltage provided by the power supply, and for providing a first comparison signal;
   a second differential amplifier coupled to the first differential amplifier for comparing the first comparison signal with the desired signal to determine when the temperature has increased.

12. An amplifier for processing signals, the amplifier comprising:
   an input port for receiving downstream signals;
   an output port for transporting upstream signals;
   a power supply for providing a voltage;
   a transponder coupled between the input port and the output port, and for receiving a command and for providing a monitor signal, wherein the monitor signal indicates the current status of the amplifier and is transported upstream; and
   a module coupled to the power supply and the transponder for processing signals, the module comprising:
      an integrated circuit for processing the signals; and
      a thermal protective device for regulating a temperature of the integrated circuit, the thermal protective device comprising:
         thermal sensing means for detecting the temperature of the integrated circuit and for providing a temperature signal indicative of the temperature; and
         a thermal controller, comprising:
            a first differential amplifier coupled to the thermal sensing means and the power supply;
            a second differential amplifier coupled to the first differential amplifier and a reference resistor, wherein the reference resistor is coupled to the power supply to provide control thereof; and
            a voltage controller coupled to the second differential amplifier for providing a control signal;
            a current controller coupled to the second differential amplifier for providing a current limiting signal; and
            a status monitor controller coupled to the second differential amplifier for providing the monitor signal to the transponder, wherein the monitor signal is indicative of the control signal and the current limiting signal.

* * * * *

UNITED STATES PATENT AND TRADEMARK OFFICE
CERTIFICATE OF CORRECTION

PATENT NO. : 6,587,002 B1
DATED : July 1, 2003
INVENTOR(S) : Vogt

It is certified that error appears in the above-identified patent and that said Letters Patent is hereby corrected as shown below:

Column 2,
Line 9, delete "he" and insert therefore -- the --.

Column 4,
Lines 30-31, add -- example, -- between "for" and "be".

Column 6,
Line 12, delete "workgtation" and insert therefore -- workstation --.
Line 23, delete "ally" and insert therefore -- any --.

Signed and Sealed this

Sixteenth Day of March, 2004

JON W. DUDAS
*Acting Director of the United States Patent and Trademark Office*